United States Patent
Isobe

(10) Patent No.: US 7,345,913 B2
(45) Date of Patent: Mar. 18, 2008

(54) SEMICONDUCTOR MEMORY DEVICE

(75) Inventor: Katsuaki Isobe, Yokohama (JP)

(73) Assignee: Kabushiki Kaisha Toshiba, Tokyo (JP)

(\*) Notice: Subject to any disclaimer, the term of this patent is extended or adjusted under 35 U.S.C. 154(b) by 14 days.

(21) Appl. No.: 11/476,567

(22) Filed: Jun. 29, 2006

(65) Prior Publication Data

US 2007/0008779 A1 Jan. 11, 2007

(30) Foreign Application Priority Data

Jun. 29, 2005 (JP) ............................. 2005-190689

(51) Int. Cl.
*G11C 11/34* (2006.01)
*G11C 16/04* (2006.01)

(52) U.S. Cl. .................... 365/185.03; 365/185.17; 365/185.23; 365/185.24; 365/211

(58) Field of Classification Search ........... 365/185.03, 365/185.17, 185.23, 185.24, 185.28, 211
See application file for complete search history.

(56) References Cited

U.S. PATENT DOCUMENTS 6,667,904 B2\* 12/2003 Takeuchi et al. ....... 365/185.03
6,970,391 B2\* 11/2005 Watanabe et al. ........... 365/211

2007/0008779 A1 1/2007 Isobe

FOREIGN PATENT DOCUMENTS

JP 2002-170391 6/2002

OTHER PUBLICATIONS

U.S. Appl. No. 11/836,378, filed Aug. 9, 2007, Isobe.

\* cited by examiner

*Primary Examiner*—Anh Phung
*Assistant Examiner*—Toan Le
(74) *Attorney, Agent, or Firm*—Oblon, Spivak, McClelland, Maier & Neustadt, P.C.

(57) ABSTRACT

A semiconductor memory device, comprising: a memory cell array of a plurality of memory cell units, each memory cell unit including a plurality of serially connected memory cells formed on the same well region, each memory cell having a floating gate and a control gate stacked, said serially connected memory cells having one end serially connected to a first selection gate transistor, said serially connected memory cells having the other end connected to a common source line via a second selection gate transistor; a sense amp connected to one end of said first selection gate transistor via a bit line and operative to read data out of said memory cell array; and wherein a voltage applied to said well region and said source line varies to cancel a change of threshold of said memory cells depending on the temperature.

16 Claims, 14 Drawing Sheets

SEMICONDUCTOR MEMORY DEVICE

CROSS REFERENCE TO RELATED APPLICATION

This application is based on and claims the benefit of prior Japanese Patent Application No. 2005-190689, filed on Jun. 29, 2005, the entire contents of which are incorporated herein by reference.

BACKGROUND OF THE INVENTION

1. Field of the Invention

The present invention relates to a semiconductor memory device.

2. Description of the Related Art

In a non-volatile memory cell, typically an NAND-type flash memory, writing is performed by applying a high electric field to trap electrons in an oxide film to vary the threshold of the cell, and reading is performed with the use of a difference in threshold thereof. In recent years, a multivalue storage technology to store data of two or more bits in a single memory cell came in to use. This makes it possible to increase the memory capacity by several times in the same physical cell size.

The conventional reading in the NAND-type flash memory first includes charging a precharge voltage on a bit line. A read voltage is then applied to a read-desired word line, and an ON-enabling voltage is applied to other word lines. Thereafter, an ON-enabling voltage is also applied to a selection transistor located between the bit line and the NAND-type flash memory. In this case, if the read-desired cell is kept ON, a cell current flows therein to lower the voltage on the precharged bit line. To the contrary, if it is kept OFF, no cell current flows therein, and the bit line is kept at the precharged voltage. The voltage precharged on the bit line is identified to determine H/L of the memory cell. The threshold of the memory cell varies depending on the temperature and thus it has a temperature characteristic. Therefore, when a constant voltage is applied to a selected word line in the NAND-type flash memory for reading, a deviation arises depending on the temperature and accordingly the read-desired data may not be read out. Therefore, in the conventional art, a temperature characteristic is imparted to the selected word line so that the voltage applied to the selected word line on reading is varied depending on the temperature to read data out of the memory cell. (See JP 2002-170391, on page 11, FIG. 1, for example).

If the temperature characteristic is imparted to the selected word line and the voltage is applied thereto as above, there are needs for a voltage set for reading or verifying, a process of trimming the voltage and, in the case of multivalue, a temperature characteristic-imparted voltage per threshold distribution. Further, in a binary or higher multivalue memory cell, a circuit is required to generate read voltages with temperature characteristics imparted thereto in accordance with the number of multiple values. This causes a problem because the circuit scale becomes too large and trimming can not be performed. cl SUMMARY OF THE INVENTION In an aspect the present invention provides a semiconductor memory device, comprising: a memory cell array of a plurality of memory cell units, each memory cell unit including a plurality of serially connected memory cells formed on the same well region, each memory cell having a floating gate and a control gate stacked, said serially connected memory cells having one end serially connected to a first selection gate transistor, said serially connected memory cells having the other end connected to a common source line via a second selection gate transistor; a sense amp connected to one end of said first selection gate transistor via a bit line and operative to read data out of said memory cell array; and wherein a voltage applied to said well region and said source line varies to cancel a change of threshold of said memory cells depending on the temperature.

DETAILED DESCRIPTION OF THE INVENTION

Embodiment 1

Figure 1:
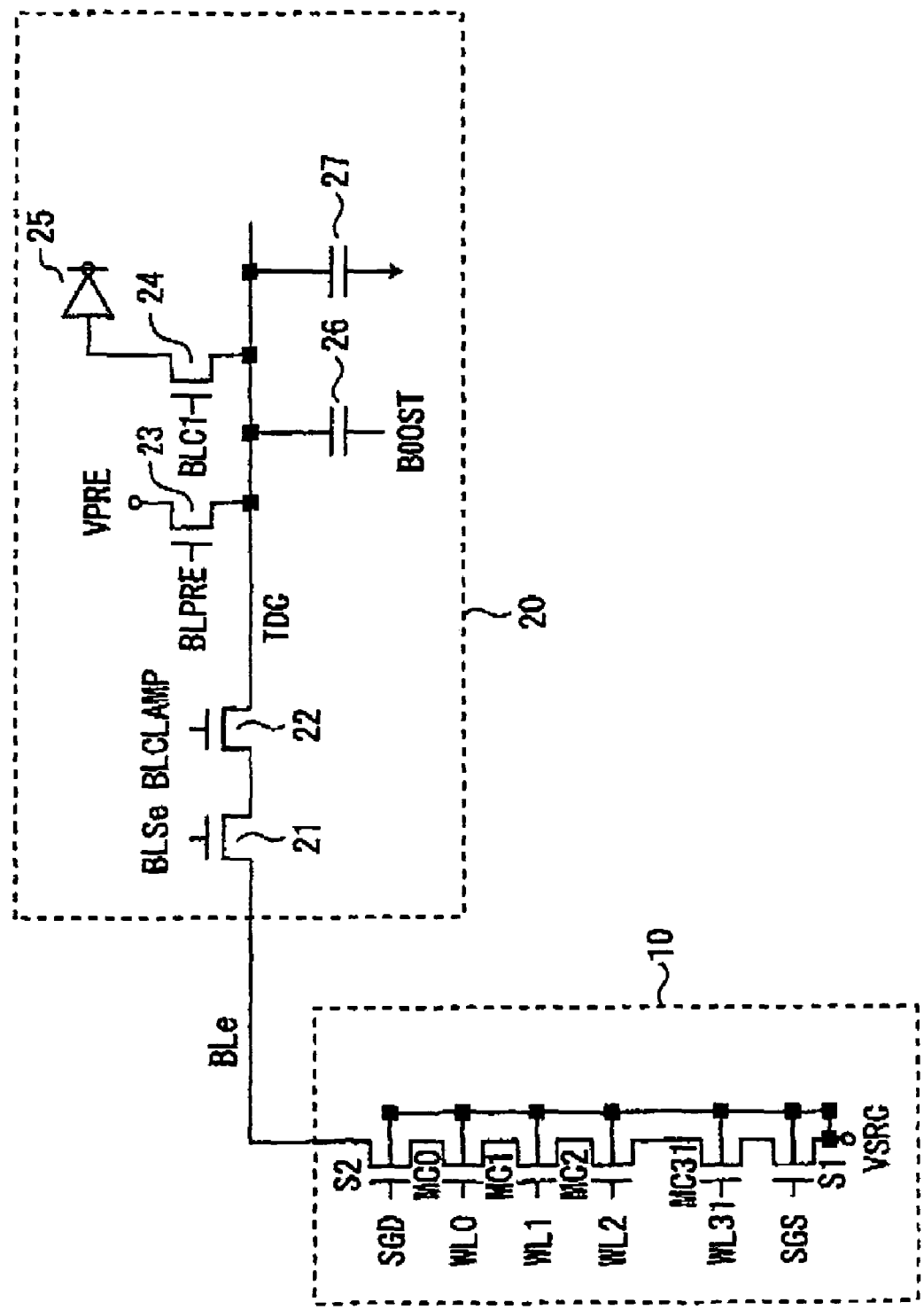
FIG. 1 is a circuit diagram illustrative of a semiconductor memory device according to an embodiment 1.

FIG. 1 is a circuit diagram illustrative of a semiconductor memory device according to an embodiment 1 of the present invention. As shown in FIG. 1, the semiconductor memory device comprises an NAND cell unit 10, and a sense amp circuit 20 connected to a bit line to which the cell unit is connected. In general, an NAND cell array includes a plurality of NAND cell units while FIG. 1 shows only one of the NAND cell units.

The NAND cell unit 10 includes 32 serially connected memory cells MC0-MC31, and selection gate transistors S1, S2 connected to both ends thereof. The source of the selection gate transistor S1 and the well of the memory cells MC0-MC31 are connected to a common source line (supply line) VSRC, and the drain of the selection gate transistor S2 is connected to a bit line BLe. The control gates of the memory cells MC0-MC31 are connected to respective word lines WL0-WL31, and the gates of the selection gate transistors S1, S2 are connected to selection gate lines SGS, SGD.

The memory cells MC0-MC31 are NAND memory cells and formed on the same well. The memory cells share a source/drain diffusion layer between adjacent ones and each have a floating gate and a control gate (word line) in a stacked structure.

In the sense amp circuit 20, the bit line BLe is connected to a sense node TDC through an NMOS transistor 21 controlled by a control signal BLSe and through an NMOS transistor 22 controlled by a control signal BLCLAMP. The NMOS transistor 21 is a transistor that is turned ON when a desired NAND cell unit is selected. On the other hand, the NMOS transistor 22 serves to control the bit line voltage and amplifying the bit line voltage on reading. The sense node TDC is connected to an NMOS transistor 23 controlled by a control signal BLPRE for use in precharging the bit line BLe, and capacitors 26, 27 operative to hold the voltage on the charged sense node TDC. The capacitor 26 is connected to a control voltage BOOST while the other capacitor 27 is connected to the ground. The sense node TDC transfers the voltage charged from the memory cell, via an NMOS transistor 24 controlled by a control signal BLC1, to the gate of an inverter 25, which determines H/L from the transferred voltage on the sense node TDC. As for the NMOS transistor 24 and the inverter 25, similarly configured circuits are connected in parallel corresponding to respective NAND cell units 10 connected to bit lines in parallel.

In the conventional art, temperature characteristics are imparted to the word lines WL0-WL31 while the source line and the well of the memory cell are kept at 0 V. To the contrary, in the above-configured semiconductor memory device, no temperature characteristic is imparted to the word lines. Instead, the source line of the selection gate transistor and the well of the memory cell are connected to the supply line VSRC, and a temperature characteristic is imparted to the supply line VSRC. Further, the temperature characteristic-imparted supply line VSRC requires a temperature characteristic to be imparted to the precharge voltage on the bit line BLe. Accordingly, a temperature characteristic is also imparted to the control signal BLCLAMP applied to the NMOS transistor 22 operative to control the voltage for use in precharging the bit line BLe.

Figure 2:
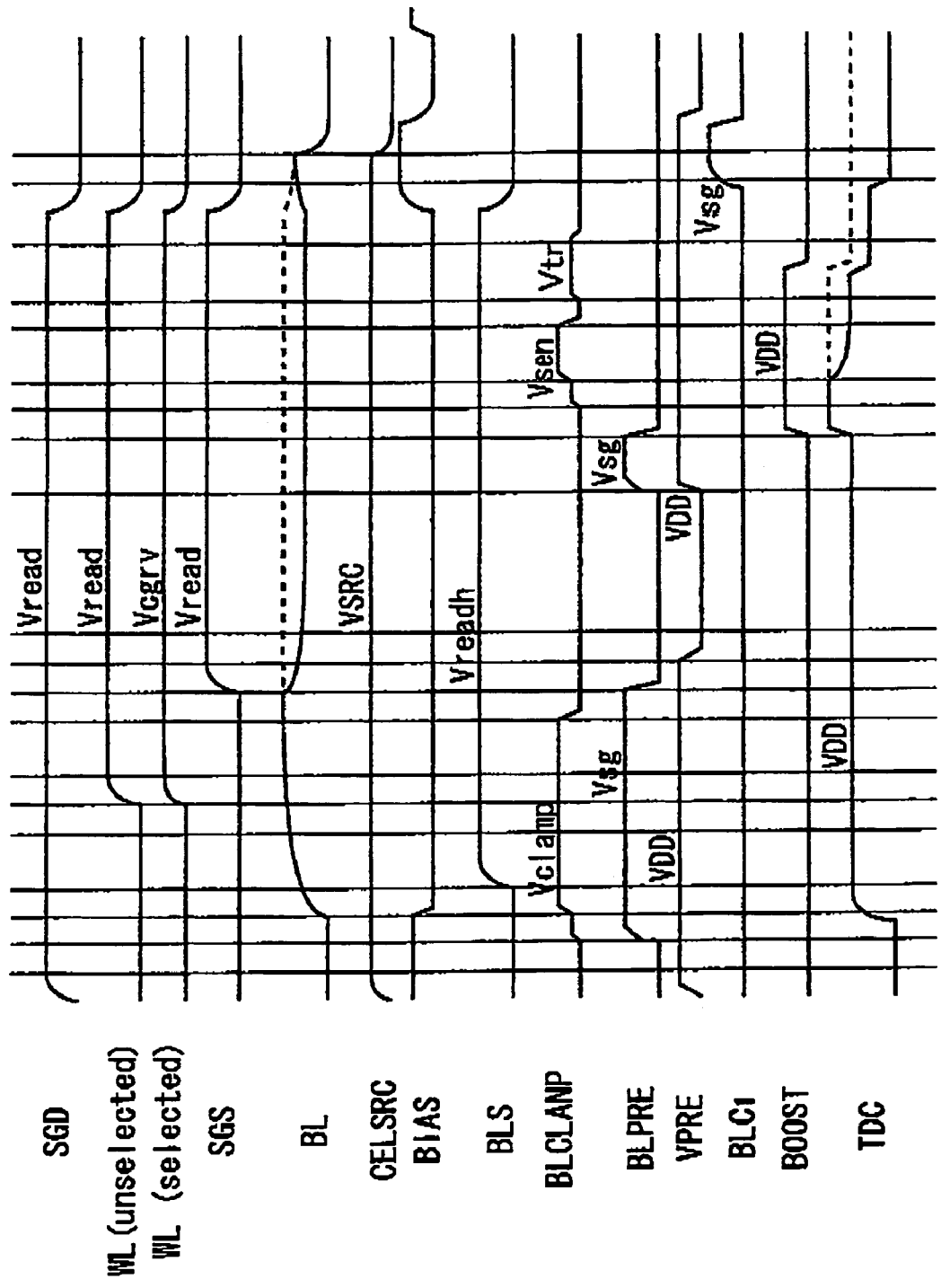
FIG. 2 is a timing chart illustrative of operation of the semiconductor memory device according to the embodiment 1.

Operation of reading from the memory cell shown in the circuit diagram of FIG. 1 is described with the use of a timing chart of FIG. 2. As the temperature characteristic-imparted voltage is applied to the supply line VSRC connected to the source line and the well of the memory cells MC0-MC31, the applied voltage is herein referred to as VSRC(T). In order to correspond to the case where temperature characteristics are imparted to the word lines WL0-WL31, the voltage VSRC(T) has a plus/minus-reversed temperature characteristic in contrast with the temperature characteristic imparted to the threshold of the memory cell.

First, a voltage VDD is given to the control signal VRPE for use in precharging the bit line, and a voltage Vsg (VDD+Vth) is given to the control voltage BLPRE to allow the N-channel MOSFET to transfer the voltage VDD therethrough. Thereafter, a voltage VCLAMP (0.7 V+Vth+VSRC(T)) is given to the control signal BLCLAMP, and a voltage Vreadh capable of turning ON the NMOS transistor 21 is also given to the control signal BLSe. As a result, the bit line BLe is precharged up to the voltage (0.7 V+VSRC(T)). The voltage to be precharged on the bit line BLe is 0.7 V. After completion of precharging the bit line BLe, the control signal BLCLAMP is turned to 0 V, and the bit line BLe is isolated from the sense amp unit 20.

Then, a voltage VCGRV is given to a read-desired word line (selected), then an ON-enabling voltage VREAD to other word lines (non-selected) and the selection gate line SGD, and finally the voltage VREAD to the selection gate line SGS. As a result, data can be read out of the selected memory cell to the bit line BLe. In a word, when the read-desired memory cell is made on by the voltage VCGRV, a cell current flows therein and the voltage on the bit line BLe approaches VSRC(T). To the contrary, when the memory cell is made off, no cell current flows therein and, as shown with the broken line, the bit line BLe remains at the precharge voltage (0.7 V+VSRC(T)).

Next, the control voltage VPRE and the control voltage BLPRE are controlled to rise to precharge the sense node TDC up to the voltage VDD. Thereafter, the control voltage BOOST is controlled to rise to boost the sense node TDC up to about 4.5 V through capacitive coupling. Then, the control voltage BLCLAMP is set to a voltage VSEN (0.35 V+Vth+VSRC(T)). In this case, the sense node TDC has a lighter capacitance than the capacitance of the bit line BLe. Accordingly, when the BL level is lower than the ON cell by (0.35 V+VSRC(T)), charge sharing occurs and the voltage on the sense node TDC becomes equal to voltage level of the bit line BL. If the voltage level of the bit line BL is made equal to (0.7 V+VSRC(T)) by the OFF cell, the transistor 22 supplied with the control voltage BLCLAMP remains turned off because it is not possible to exceed the threshold, and the sense node TDC remains at 4.5 V as shown with the broken line.

Then, after the control voltage BLCLAMP is controlled to drop once, a voltage Vtr slightly higher than the threshold of the NMOS transistor 22 supplied with the control voltage BLCLAMP is applied. In this condition, when the control voltage BOOST is controlled to rise, the sense node TDC lowers through capacitive coupling. The sense node TDC connected to the ON cell lowers near 0 V, and the sense node TDC connected to the OFF cell returns to the voltage VDD as shown with the broken line.

Thereafter, the control voltage BLC1 is controlled to rise to transfer the voltage on the sense node TDC to the gate of the inverter to determine H/L.

Thus, even if the temperature characteristic-imparted control voltage VSRC is applied to the source line and the well of the memory cell, reading from the memory cell can be performed.

FIG. 3 shows diagrams of a power supply circuit for the temperature characteristic-imparted voltage VSRC applied to the source line and the well of the memory cell. FIG. 4 shows an example of a power supply circuit for the temperature characteristic-imparted voltage BLCLAMP.

Figure 3A:
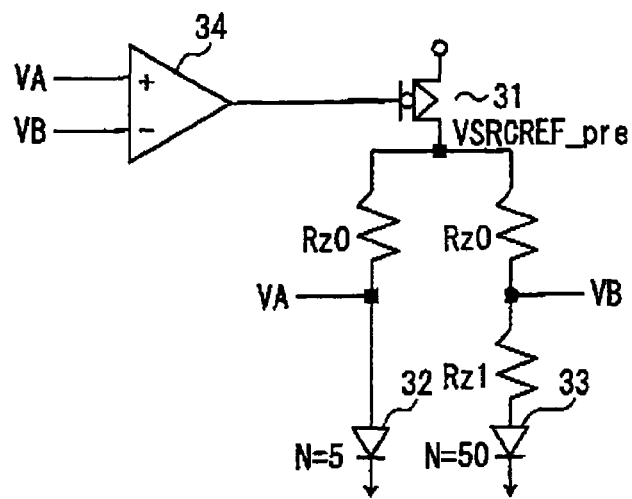
FIG. 3 shows circuit diagrams applied to generate a temperature characteristic-imparted voltage VSRC in the semiconductor memory device according to the embodiment 1.
Figure 3B:
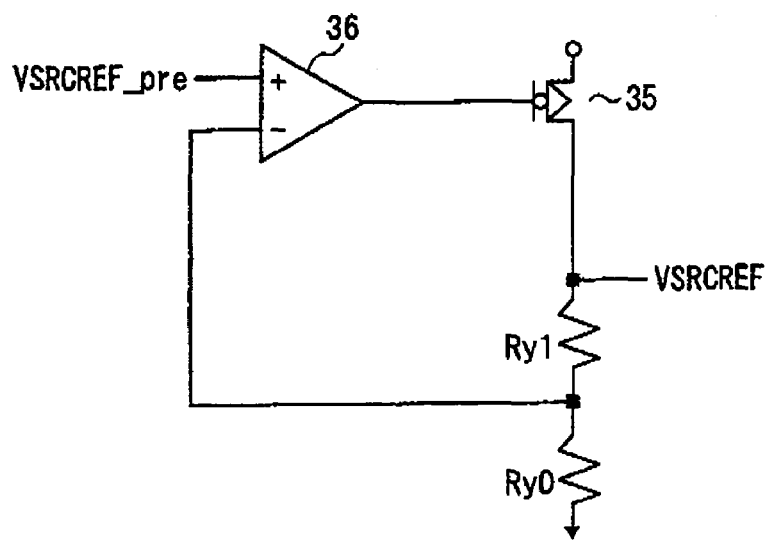
Figure 3C:
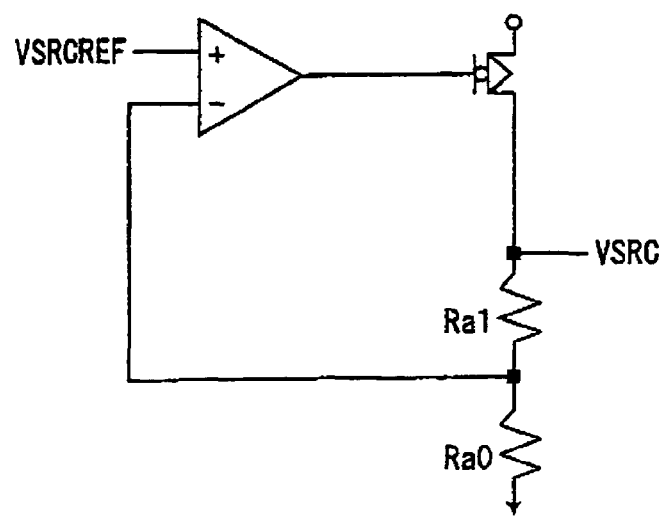

As shown in FIG. 3, the voltage VCRC is generated using a bandgap circuit (BGR circuit) of FIG. 3A and circuits of FIGS. 3B, 3C configured to adjust the signal output from the BGR circuit to an optimal voltage VSRC.

As shown in FIG. 3A, the BGR circuit includes a PMOS transistor 31 having a source connected to the supply voltage. The PMOS transistor has a drain grounded through a resistor Rz0 and a diode 32 in one way and grounded through a resistor Rz0, a resistor Rz1 and a diode 33 in the other way. A voltage Va generated on a node between Rz0 and the diode 32 and a voltage Vb generated on a node between the resistor Rz0 and the resistor Rz1 are fed back to a differential amplifier 34. The differential amplifier 34 provides an output signal, which is led to the gate of the PMOS transistor 31.

The resultant control voltage VSRCRFF_pre is represented by the following expression.

$$VSRCRFF\_pre(T)=\delta VSRCRFF\_pre(0)+\beta T$$

As for the voltage VSRC(T), the gradient of the temperature characteristic having a desired temperature dependency can be determined by varying the resistors Rz0, Rz1.

Further, the voltage VSRCRFF_pre is amplified by a times through a circuit 40 and provided as a voltage VSRCREF as shown in FIG. 3B.

As shown in FIG. 3B, a PMOS transistor 35 has a source connected to the supply voltage, and a drain connected to the output terminal VSRCREF and a resistor Ry1. The drain is connected to the ground through the resistor Ry1 and a resistor Ry0. A differential amplifier 36 has an input terminal (+) for receiving VRCRFF_pre generated at the BGR circuit and an input terminal (−) connected to a divider node between the resistor Ry0 and the resistor Ry1. The VSRCRFF_pre input to the differential amplifier 36 is amplified by a times through this circuit and the voltage VSRCREF is output from a node between the PMOS transistor 35 and the resistor Ry1.

The resultant voltage VSRCREF is represented by the following expression.

$$VSRCREF(T)=\alpha\delta VSRCRFF\_pre(0)+\alpha\beta T$$

$$\alpha=(Ry1+Ry0)/Ry0$$

$$\alpha\delta=\text{Const. }(T=0)$$

In this case, α is determined such that αδ remains always constant. In a word, a variation in Ry0, Ry1 varies the gradient of the temperature characteristic while the voltage VSRCREF at T=0 is set unchanged.

Further, the voltage VSRCREF is amplified by γ times through a circuit 50 with a differential amplifier 37 and a PMOS transistor 38 to generate a temperature characteristic-imparted voltage VSRCREF as shown in FIG. 3C.

The circuit arrangement shown in FIG. 3C is similar to the circuit arrangement of FIG. 3B except for resistors Ra0, Ra1 employed to multiply the voltage VSRCREF by γ.

The resultant control voltage VSRC is represented by the following expression.

$$VSRC(T)=\alpha\delta\gamma VSRCRFF\_pre(0)+\alpha\beta\gamma T$$

In this case, the voltage VSRC(T) can be set with γ=(Ra1+Ra0)/Ra0, αδγ=Const., γαβ=Const., and β=γConst.

As obvious from the foregoing, αδγ is constant, and αβγ becomes a temperature coefficient. Therefore, variations in Ry0, Ry1, Rz0, Rz1 for trimming lead to easy generation of the temperature characteristic-imparted voltage VSRC on the source line. For the generation of the voltage VSRC, the voltage VSRCRFF_pre is amplified by α times and β times to generate the voltage VSRC. Alternatively, the voltage VSRCRFF_pre may be amplified once to generate the voltage VSRC.

Figure 4A:
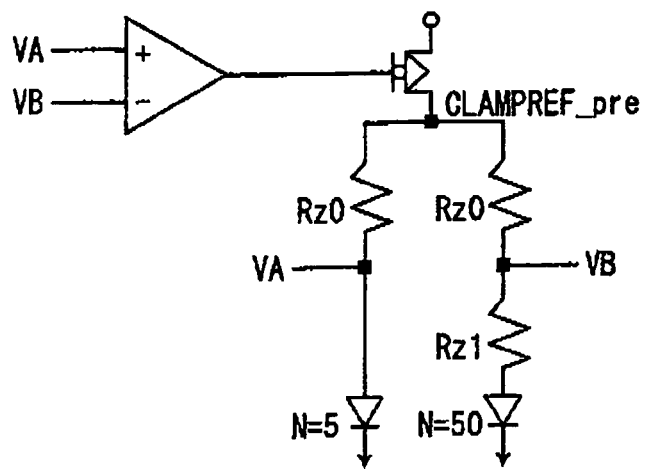
FIG. 4 shows circuit diagrams applied to generate a temperature characteristic-imparted voltage BLCLAMP in the semiconductor memory device according to the embodiment 1.
Figure 4B:
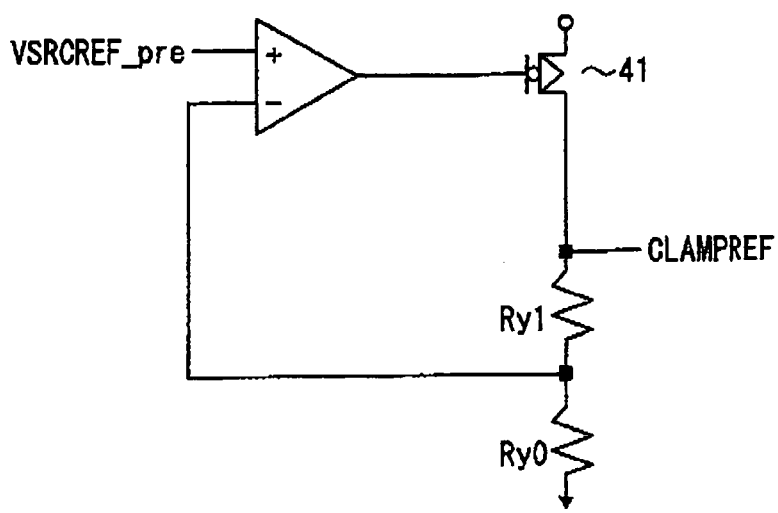

FIG. 4 shows a power supply circuit for imparting a temperature characteristic to the control signal BLCLAMP. As shown in FIG. 4A, with the use of a differential amplifier 43 and PMOS transistor 44, the voltage CLAMPRFF_pre can be generated in the same arrangement as those in FIG. 3A. As shown in FIG. 4B, with the use of differential amplifier 45 and PMOS transistor 41 the voltage CLAMPRFF can be generated in the same arrangements as those arrangement as those in FIG. 3B.

The resultant voltage CLAMPRFF_pre(T), voltage CLAMPRFF(T), is represented by the following expression.

$$CLAMPRFF\_pre(T)=\delta CLAMPRFF\_pre(0)+\beta T$$

In this case, the gradient of the temperature characteristic imparted on the control voltage BLCLAMP(T) can be determined to have a desired value by varying the resistors Rz0, Rz1.

The voltage CLAMPRFF(T) is represented by the following expression.

$$CLAMPRFF(T)=\alpha\delta CLAMPRFF\_pre(0)+\alpha\beta T$$

In this case, α is determined such that αδ remains always constant. In a word, a variation in Ry0, Ry1 varies the gradient of the temperature characteristic while the voltage CLAMPRFF at T=0 is set unchanged.

Figure 4C:
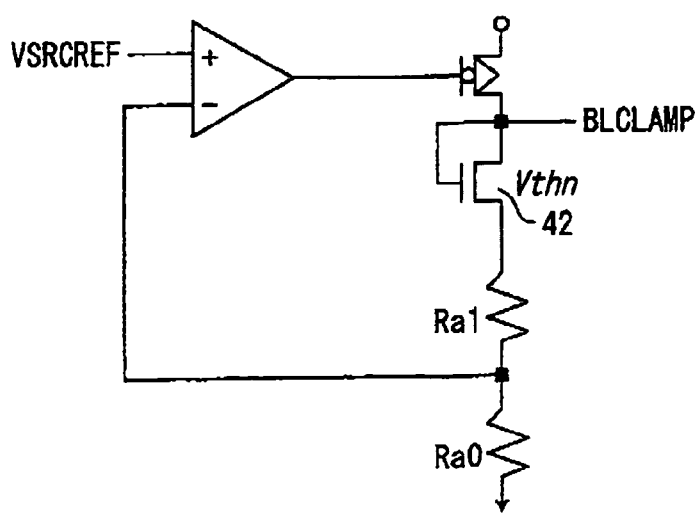

Next, as shown in FIG. 4C, the voltage CLAMPRFF generated in FIG. 4B is input to a differential amplifier 46 to generate the control voltage BLCLAMP. The circuit structure includes an NMOS transistor 42 provided between the PMOS transistor 41 (47) and the resistor Ry1 (Ra1) of FIG. 4B. The NMOS transistor 42 has a threshold Vthn, and the gate thereof is connected to the output terminal of the control voltage BLCLAMP. And the NMOS transistor 42 is connected to the drain of the PMOS transistor 47.

The resultant control voltage BLCLAMP is represented by the following expression.

$$BLCLAMP(T)=\alpha\delta\gamma CLAMPRFF\_pre(0)+\alpha\beta\gamma T+Vthn$$

In this case, the voltage BLCLAMP(T) can be set with γ=(Ra1+Ra0)/Ra0, αδγ=Const., γαβ=Const., and β=γConst. As shown in the timing chart of FIG. 3, a voltage value other than the threshold Vthn represents a voltage desired to be precharged on the bit line BLe. Accordingly, in accordance with this value, the precharge voltage temperature characteristic imparted is genarated.

As obvious from the foregoing, αδγ=constant, and αβγ=a temperature coefficient. Therefore, variations in Ry0, Ry1, Rz0, Rz1 for trimming lead to easy generation of the temperature characteristic-imparted voltage BLCLAMP. For the generation of the voltage BLCLAMP, the voltage BLCLAMP_pre is amplified by α times and β times to generate the voltage VSRC. Alternatively, the voltage BLCLAMP_pre may be amplified once to generate the voltage BLCLAMP.

Figure 5:
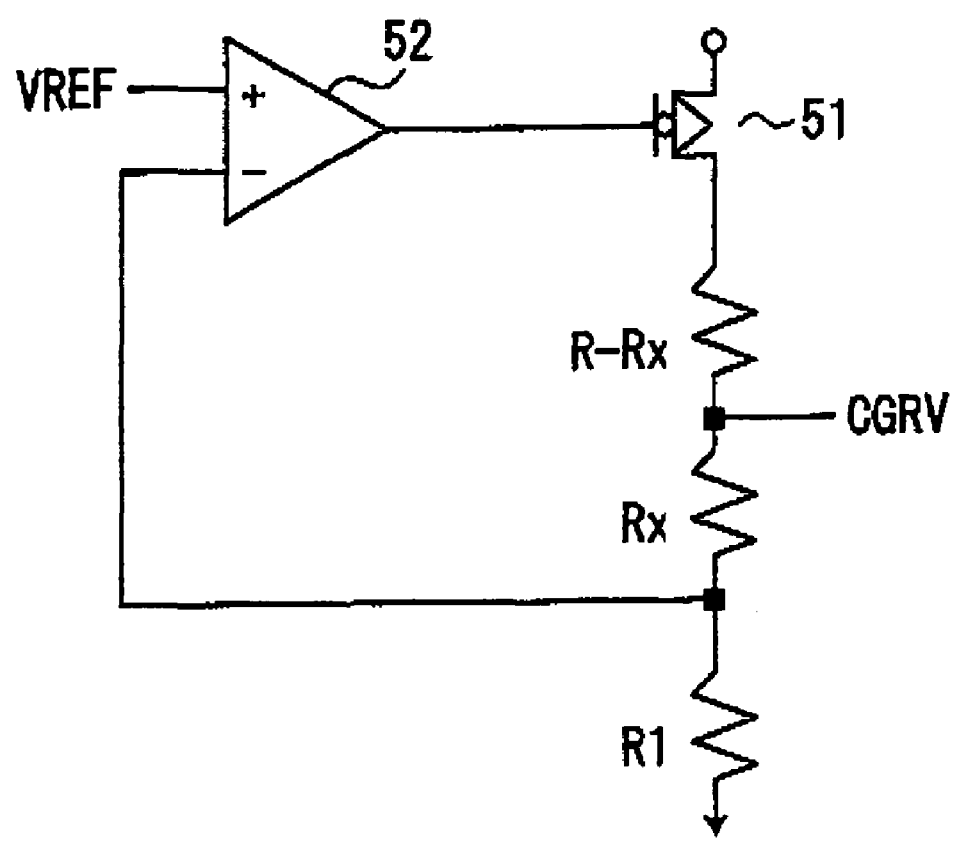
FIG. 5 shows a circuit diagram applied to generate a word line voltage VCGRV in the semiconductor memory device according to the embodiment 1.

FIG. 5 shows a power generator circuit for a word line voltage VCGR generated on a word line. As shown in FIG. 5, from the supply voltage via a PMOS transistor 51, a resistor R-Rx, a resistor Rx and a resistor R1 are connected serially, connected to the ground. A divider node between the resistor Rx and the resistor R1 is fed back to a differential amplifier 52 and differentially amplified with a reference voltage VREF, and the output is connected to the gate of the PMOS transistor 51, The voltage VCGR generated at a node between the resistor R-Rx and the resistor RX is provided to the word line.

In the conventional art, a temperature characteristic is imparted to a word line. Accordingly, the structure includes the BGR circuit and the amplifier circuit. To the contrary, in the embodiment, temperature characteristics are imparted to the source line and the control voltage BLCLAMP. Accordingly, the circuit structure is made simpler such that the reference voltage VREF can be amplified with a resistance ratio. Therefore, the variation in the read voltage VCGRV can be reduced.

In the conventional art, a temperature characteristic is imparted to a word line, and the voltage on the word line is varied on reading in accordance with the temperature characteristic of the threshold. To the contrary, in the embodiment configured above, no temperature characteristic is imparted to a word line. Instead, temperature characteristics are imparted to the well of the memory cell and the source electrode to prevent the circuit scale from growing in accordance with the multivalue of the memory cell. In the multivalue memory cell of the conventional art, trimming the gradient of the temperature characteristic is impossible. To the contrary, the power supply circuits operative to generate temperature characteristic-imparted voltages are provided two in total: one for the common source line and the well; and one for the control voltage BLCLAMP for use in applying a voltage to a bit line. As a result, trimming the gradient of the temperature characteristic of the memory cell can be performed easily.

Embodiment 2

Figure 6:
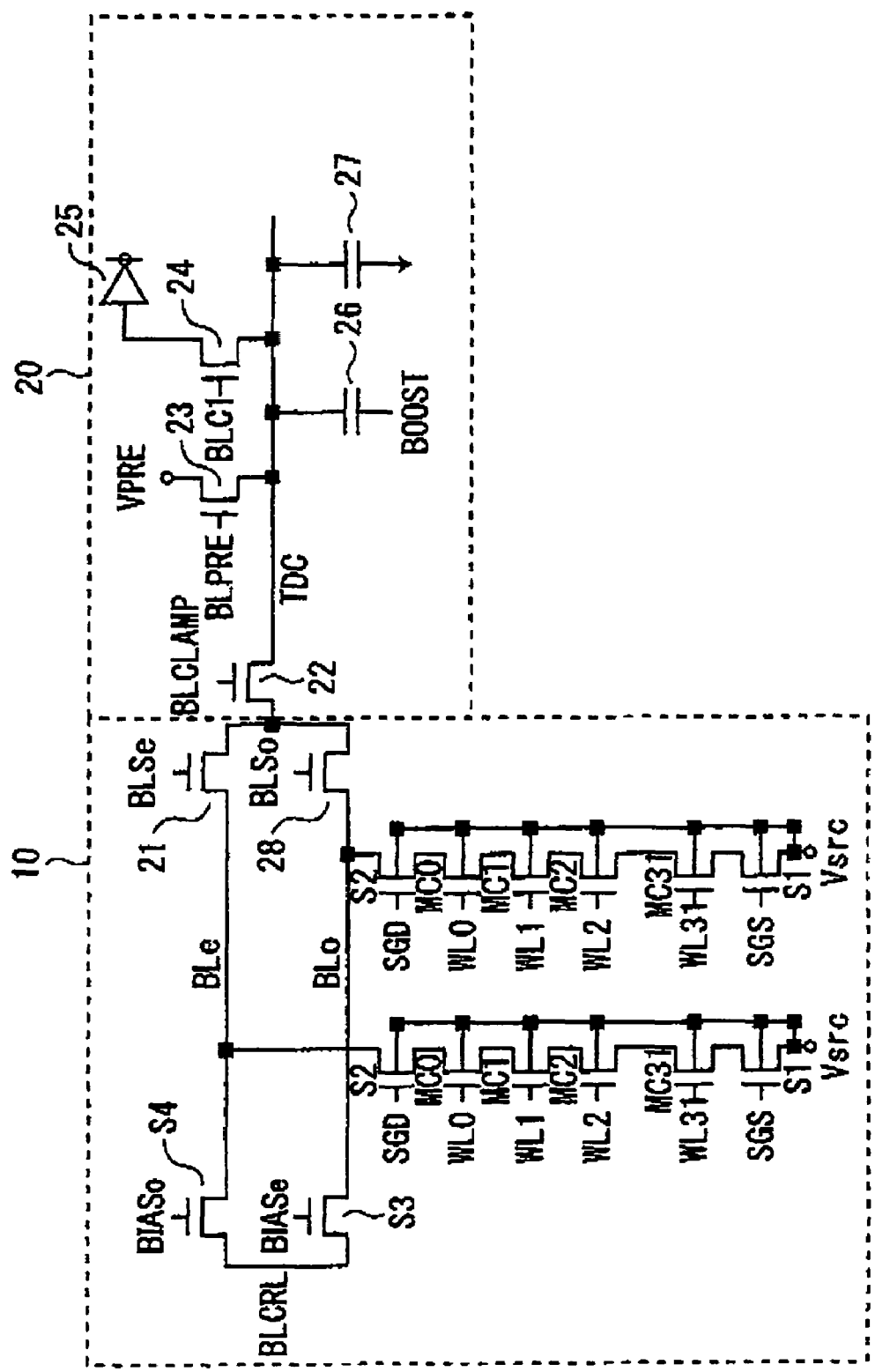
FIG. 6 is a circuit diagram illustrative of a semiconductor memory device according to an embodiment 2.

FIG. 6 is a circuit diagram illustrative of a semiconductor memory device according to an embodiment 2. In the embodiment 1 one NAND cell unit is described as an example while in this embodiment plural NAND cell units are connected to the sense amp unit. The other same elements as those in FIG. 1 are denoted with the same reference numerals and omitted from the following description. In this embodiment an example equipped with two NAND cell units is described though the number of NAND cell units is not limited to this example.

As shown in FIG. 6, the sense amp unit 20 has the same arrangement as that in the embodiment 1, which is omitted from the following description. The transistor 22 supplied with the control voltage BLCLAMP in the sense amp unit 20 is branched in accordance with the number of NAND cell units. One branch is connected to the bit line BLe via the transistor 21 having the gate connected to control voltage BLSe. The other is connected to a bit line BLo via a transistor 28 having a gate connected to control voltage BLSo. The bit line BLe and the bit line BLo are connected to respective NAND cell units at drains of selection gates S2. The NAND cell unit in this embodiment has the same structure as that in the embodiment 1. The bit line BLe and the bit line BLo are connected to a node BLCRL via transistors 53, S4 controlled by a control voltage BIASe and a control voltage BIASo.

As for the semiconductor memory device thus configured, in the conventional art temperature characteristics are imparted to the word lines WL0-WL31. To the contrary, in the embodiment the source line of the selection gate transistor and the well of the memory cell are connected to the supply line VSRC and a temperature characteristic is imparted to the supply line VSRC. The supply line VSRC is also connected to the node BLCRL, thereby supplying the temperature characteristic-imparted source voltage VSRC (T). Imparting the temperature characteristic to the supply line VSRC further requires imparting a temperature characteristic to the precharge voltage on the bit line BLe. Therefore, a temperature characteristic is also imparted to the control signal BLCLAMP applied to the NMOS transistor 22 operative to control the voltage for precharging the bit line BLe.

Reading from the memory cell shown in the circuit diagram of FIG. 6 is described with reference to timing charts of FIGS. 7 and 8. In this case, the memory cell connected to the bit line BLe is a read-desired memory cell while the memory cell connected to the bit line BLo is a read-undesired, shielded memory cell. To the supply line VSRC connected to the source line and the well of the memory cell, a temperature characteristic-imparted voltage is applied, and the applied voltage is herein referred to as a voltage VSRC(T). In order to correspond to the case where temperature characteristics are imparted to word lines WL0-WL31, the voltage VSRC(S) has a plus/minus-reversed temperature characteristic in contrast with the temperature characteristic imparted to the threshold of the memory cell.

Figure 7:
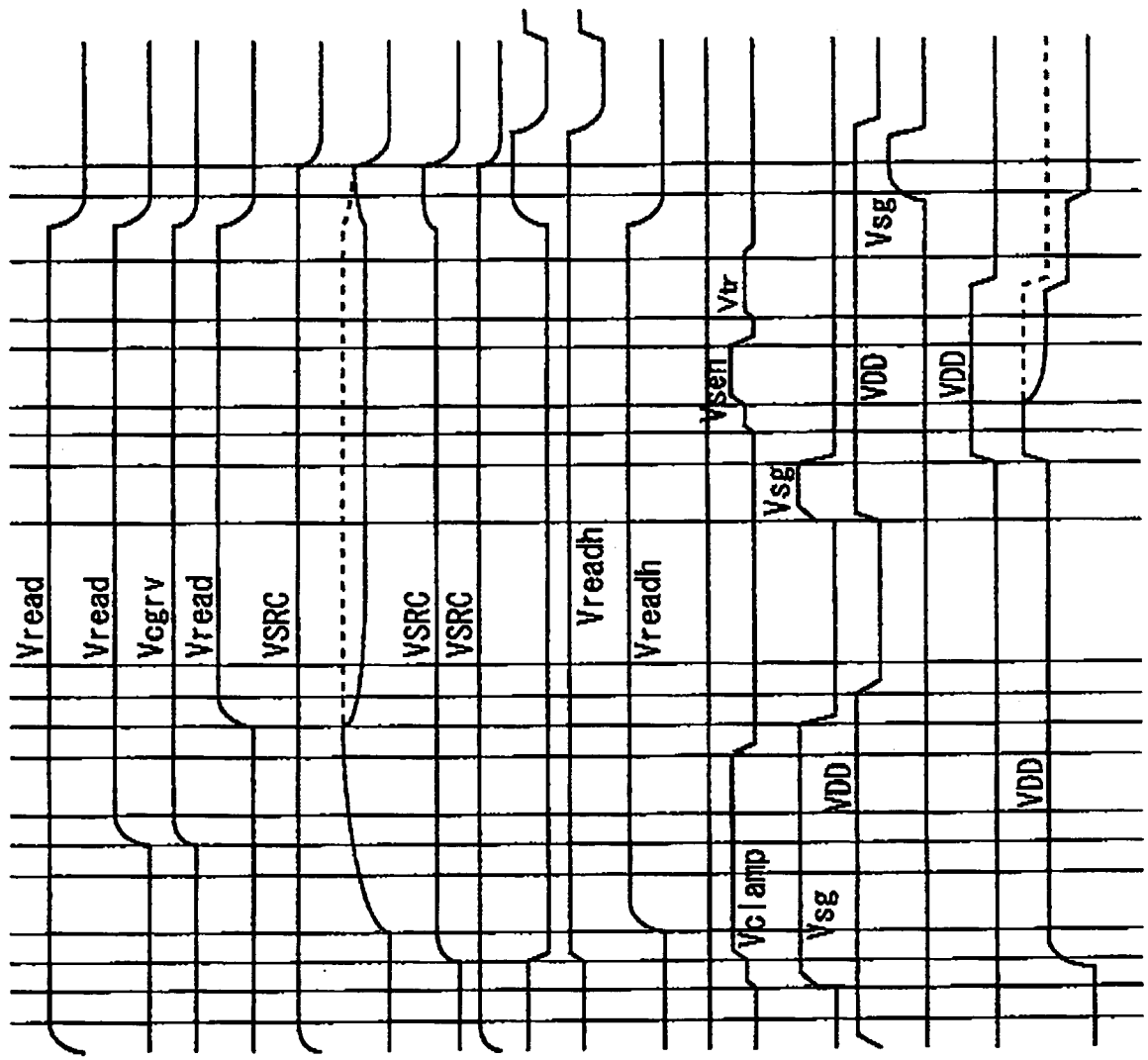
FIG. 7 is a timing chart illustrative of operation of the semiconductor memory device according to the embodiment 2.
Figure 8:
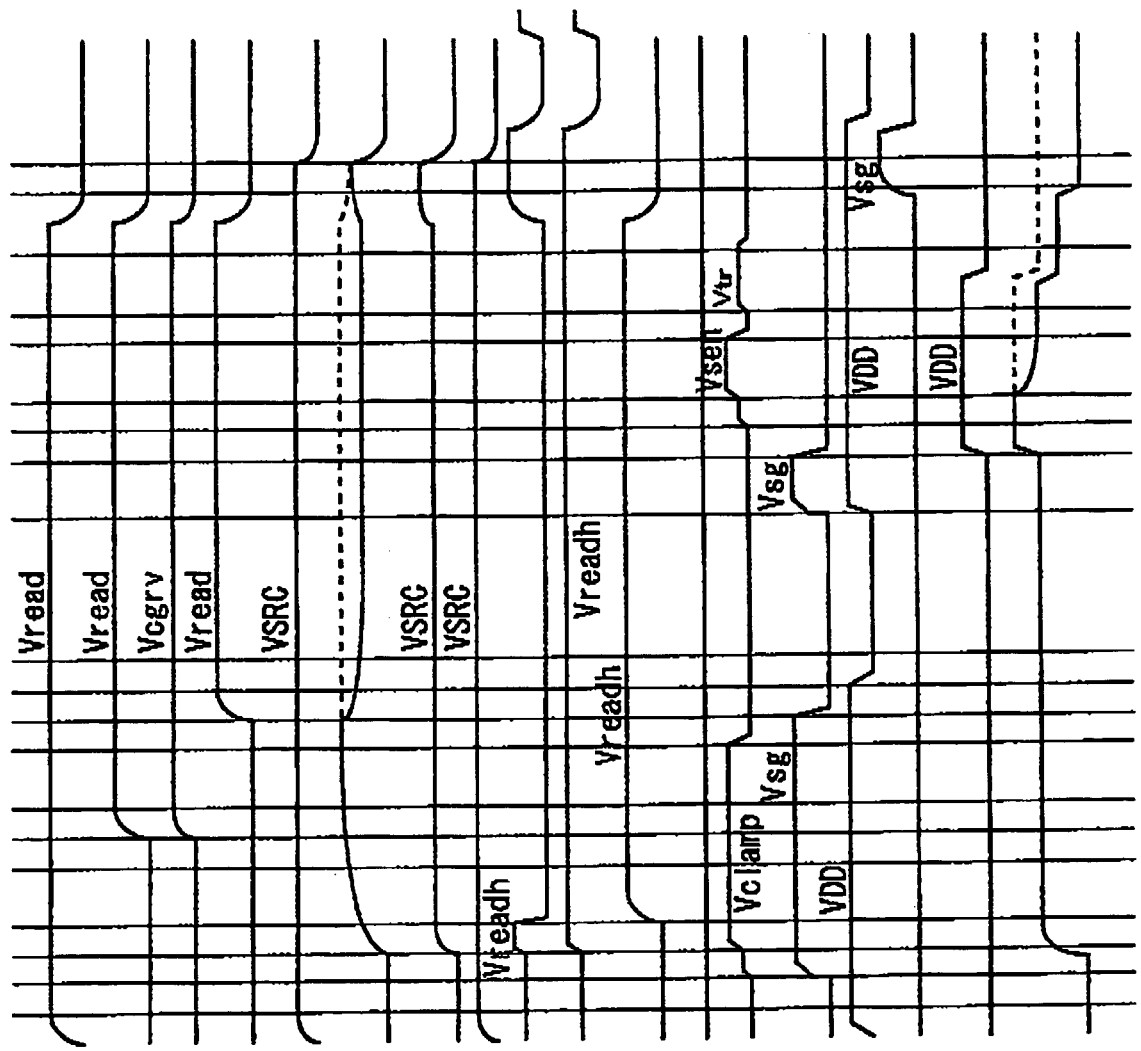
FIG. 8 is a timing chart illustrative of operation of the semiconductor memory device according to the embodiment 2.

As shown in FIG. 7, when the control voltage BIASe (=the voltage VSS) and the control voltage BIASo are controlled to rise to the voltage VREADH, the node BLCRL is connected to the non-selected bit line BLo and, as the node BLCRL is equal to the voltage VSRC(T), the non-selected bit line BLo is charged up to the voltage VSRC(T).

Next, the control voltage BLSo (=the voltage VSS) and the control voltage BLSe are controlled to rise to the voltage VREADH to apply the voltage VDD to the control voltage VPRE. And the voltage VSG (VDD+Vth) that allows the N-channel transistor 23 to transfer a voltage VDD is applied to the control voltage BLPRE. Thereafter, (0.7 V+Vth+VSRC(T)) is applied to the control voltage BLCLAMP to precharge the selected bit line BLe up to the voltage (0.7 V+VSRC(T)).

After the selected bit line BLe is precharged, the control voltage BLCLAMP is lowered to 0 V to isolate the bit line BLe from the sense amp unit.

A read voltage VCGRV is then applied to a read-desired word line WL, then an ON-enabling voltage VREAD to other word lines WL and the selection gate line SGD, and finally the voltage VREAD to the selection gate line SGS. In this case, if the read-desired cell is kept on, a cell current flows therein and the bit line BLe approaches the voltage VSRC(T). To the contrary, if the read-desired cell is kept off, no cell current flows therein and the bit line BLe remains at the precharge voltage (0.7 V+VSRC(T)).

The control voltage VPRE and the control voltage BLPRE are then controlled to rise again to precharge the sense node TDC up to the voltage VDD. As a result, the control voltage BOOST rises and boosts the sense node TDC up to about 4.5 V through capacitive coupling.

Thereafter, the control voltage BLCLAMP is set at the voltage VSEN (0.35 V+Vth+VSRC(T)). In this case, the sense node TDC has a lighter capacitance than the capacitance of the bit line BLe. Accordingly, when the bit line level is lower than the voltage (0.35 V+VSRC(T)) by ON cell, charge sharing occurs and the voltage on the sense node TDC becomes equal to the bit line level. When the voltage level of the bit line BL is made equal to (0.7 V+VSRC(T)) by the OFF cell, the transistor 22 supplied with the control voltage BLCLAMP remains turned off because it is not possible to exceed the threshold, and the sense node TDC remains at 4.5 V.

Then, after the control voltage BLCLAMP is controlled to drop once, a voltage VTR slightly higher than the threshold of the NMOS transistor 22 is applied. In this condition, when the control voltage BOOST is controlled to fall, the sense node TDC lowers through capacitive coupling. The sense node TDC connected to the ON cell lowers near 0 V while the sense node TDC connected to the OFF cell returns to the voltage VDD. Thereafter, the control voltage BLC1 is controlled to rise to transfer the voltage on the sense node TDC to the gate of the inverter to determine H/L.

Another example of reading the memory cell is described with reference to the timing chart of FIG. 8. FIG. 8 differs from FIG. 7 in that when the bit line BLe is charged up to the precharge voltage, the control voltage BIASo is controlled to rise to the voltage Vread while the control voltage BIASe is also controlled to rise simultaneously for a short time. When the control voltage BIASe rises for a short time, the bit line BLe is also charged with the voltage VSRC(T) of the node BLCRL. Thereafter, the control voltage BIASe is controlled to fall to precharge from the sense node TDC. Subsequent operation of reading the NAND memory cell is similar to the operation shown in FIG. 7.

In the above operation of reading, before a voltage is precharged on the selected bit line BLe, the selected bit line is once charged up to the voltage VSRC(T). Accordingly, it is possible to suppress the parasitic capacity between memory cells, which may cause a problem on precharging from the sense node TDC.

The voltage VSRC and the control voltage BLCLAMP, both temperature characteristic-imparted, can be obtained using the BGR circuit and a circuit operative to adjust the voltage output from the BGR circuit, like in the embodiment 1. Detailed circuit structures are similar to those in the embodiment 1 and accordingly omitted from the following description.

In the conventional art, a temperature characteristic is imparted to a word line, and the voltage on the word line is varied on reading in accordance with the temperature characteristic of the threshold. To the contrary, in the embodiment configured above, no temperature characteristic is imparted to a word line. Instead, temperature characteristics are imparted to the well of the memory cell and the source electrode to prevent the circuit scale from growing in accordance with the multivalue of the memory cell. In the conventional art, trimming the gradient of the temperature characteristic is required for each word line of the memory cell and accordingly, in the substantial multivalue memory cell, trimming the gradient of the temperature characteristic is impossible. To the contrary, the power supply circuits operative to generate temperature characteristic-imparted voltages are provided two in total: one for the common source line and the well; and one for the control voltage BLCLAMP for use in applying a voltage to a bit line. As a result, trimming the gradient of the temperature characteristic of the memory cell can be performed easily.

Embodiment 3

FIGS. 9 and 10 show circuit diagrams of a semiconductor memory device according to an embodiment 3 of the present invention. This embodiment differs from the preceding embodiments in the following. In the preceding embodiments, the voltage on the supply line VSRC and the control voltage BLCLAMP, both temperature characteristic-imparted, are generated using the BGR circuit and so forth. To the contrary, in this embodiment, generation of the temperature characteristic-imparted voltage on the supply line VSRC is left as it is and the temperature characteristic-imparted voltage VSRC is used to generate the control voltage BLCLAMP.

A voltage generator for the control voltage BLCLAMP is shown in the following circuit diagrams.

Figure 9A:
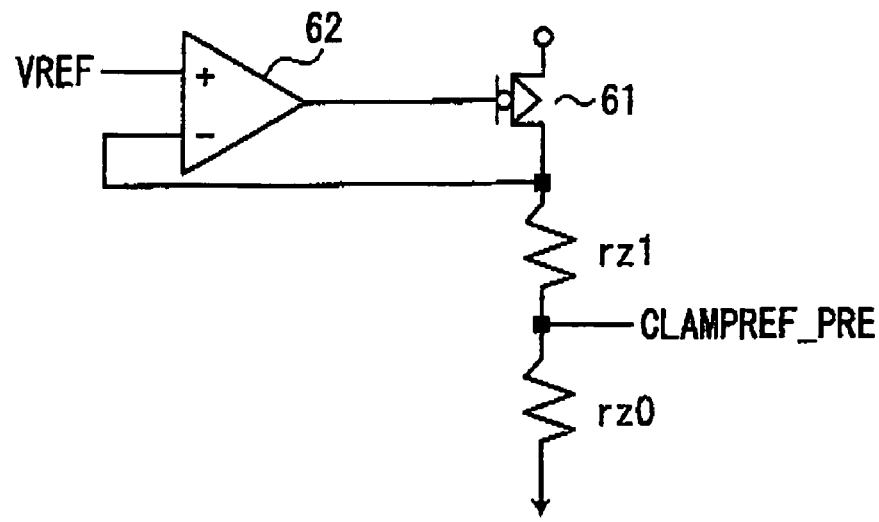
FIG. 9 shows circuit diagrams of a semiconductor memory device according to an embodiment 3.

First, as shown in FIG. 9A, the reference voltage VREF and a voltage fed back from a node between a PMOS transistor 61 and a resistor Rz1 are input to a differential amplifier 62. The voltage output from the differential amplifier 62 is fed to the gate of the PMOS transistor 61, and a voltage CLAMPREF_pre is provided from a node between the resistor Rz1 and a resistor Rz0. The voltage CLAMP_pre corresponds to the voltage Vpre or the voltage Vsen required for reading.

Figure 9B:
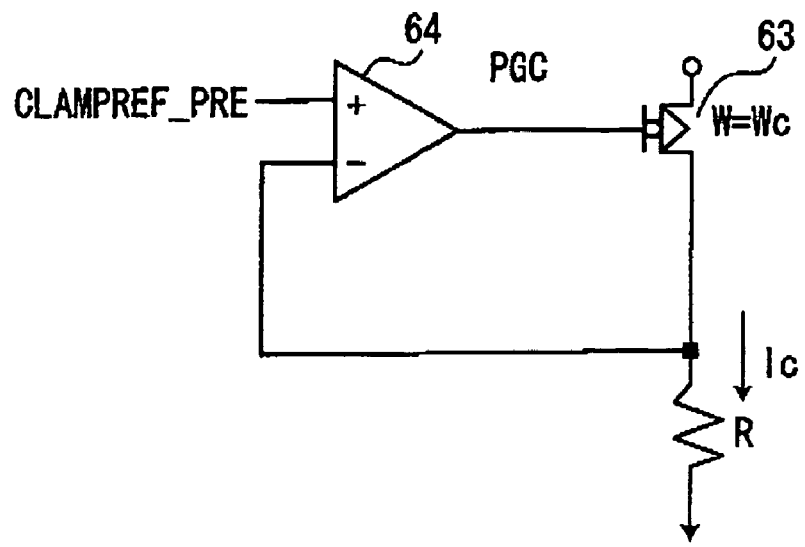

Next, as shown in FIG. 9B, the supply voltage is connected to the source of a PMOS transistor 63, and the drain thereof is connected through a resistor R to the ground. A differential amplifier 64 receives the voltage CLAMREF_pre at one input and a voltage fedback from the output node between the PMOS transistor 63 and the resistor R at the other input, and generates a voltage PGC to be provided to the gate of the PMOS transistor 63. The resistor R is adjusted to generate the voltage PGC such that the current Ic flowing in the resistor R satisfies Ic=Vpre/R.

Figure 10A:
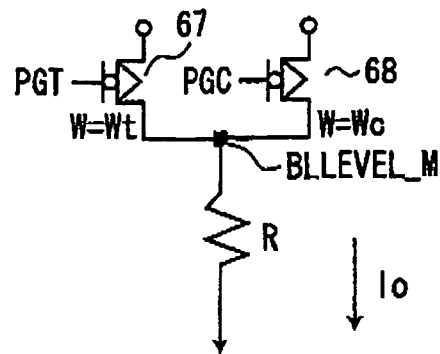
FIG. 10 shows circuit diagrams of the semiconductor memory device according to the embodiment 3.
Figure 10B:
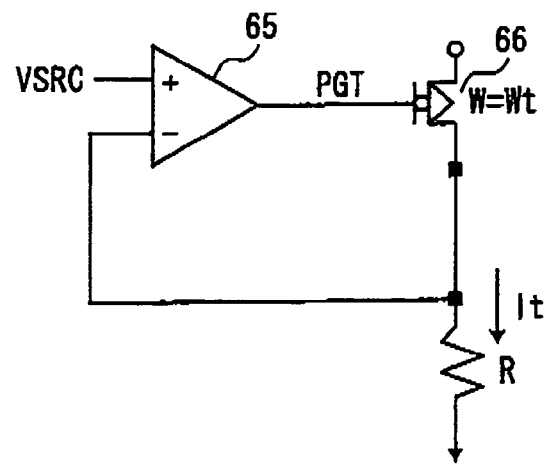

In parallel with this, as shown in FIG. 10B, a circuit configured as similar to FIG. 9B is used to feed the voltage VSRC(T) and a voltage at a node between a PMOS transistor 66 and the resistor R to a differential amplifier 65. A voltage PGT output from the differential amplifier 65 is provided to the gate of the PMOS transistor 66. The resistor R is adjusted to generate the voltage PGT such that the current It flowing in the resistor R satisfies It=VSRC/R.

Next, as shown in FIG. 10A, the voltage PGC and the voltage PGT generated in FIGS. 9B and 10B are used to generate a voltage BLLEVEL_M. A circuit for generating the voltage BLLEVEL_M includes a PMOS transistor 67 having a gate supplied with the voltage PGT and a PMOS transistor 68 having a gate supplied with the voltage PGC connected in parallel. A resistor R is serially connected thereto and connected to the ground. The resistor R is adjusted such that the current I0 flowing in the resistor R satisfies (Vpre+VSRC/R) in the case of the precharge voltage Vpre, for example. The PMOS transistors 67, 68 supplied with the voltages PGT, PGC have the same thresholds as those of the PMOS transistors 63, 66 used in FIGS. 9B and 10B. In accordance with the above configuration, the voltage on the node between the parallel circuit of the PMOS transistors 67, 68 and the resistor R, the voltage BLLEVEL_M, satisfies (Vpre+VSRC) in the case of the precharge voltage Vpre, for example.

Figure 10C:
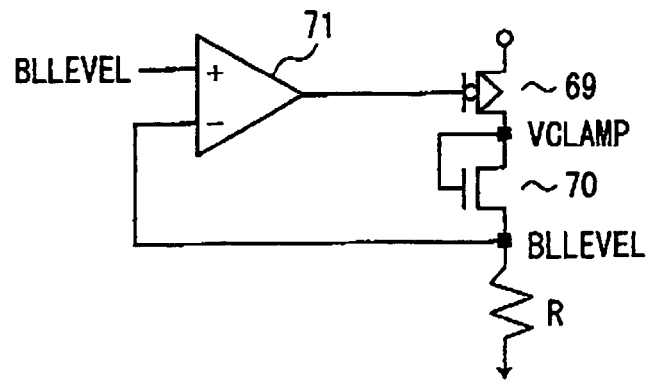

Next, as shown in FIG. 10C, the supply voltage is connected to the source of a PMOS transistor 69, and the drain thereof is connected to an NMOS transistor 70 having a threshold Vthn. The gate of the NMOS transistor 70 is connected to a node between the drain of the PMOS transistor 69 and the drain of the NMOS transistor 70. The node provides the control voltage BLCLAMP. The source of the NMOS transistor 70 is connected to the resistor R and the resistor R is connected to the ground. A voltage BLLEVEL generated on a node between the resistor R and the NMOS transistor 69 is fed to a differential amplifier 71 together with the voltage BLLEVEL_M generated in FIG. 10A. And the output of the differential amplifier 71 is fed to the gate of the PMOS transistor 69. The resistor R is adjusted such that the voltage BLLEVEL satisfies (Vpre+VSRC) in the case of generation of the precharge voltage, for example.

Thus, the control voltage BLCLAMP becomes (Vpre+VSRC) plus the threshold Vthn of the NMOS transistor 70, that is, (Vpre+VSRC+Vthn). Thus, the temperature characteristic-imparted control voltage BLCLAMP can be generated in synchronization with the voltage VSRC(T). In this embodiment, generation of the temperature characteristic-imparted precharge voltage is described as an example though the similar method is also applicable to generation of the voltage Vsen on reading.

In the preceding embodiments, the voltage VSRC and the control voltage BLCLAMP, both temperature characteristic-imparted, are generated independently. To the contrary in accordance with the above configuration, the control voltage BLCLAMP is generated from the voltage VSRC, thereby combining the circuits for generating temperature characteristic-imparted voltages into one. As a result, the circuit scale can be further suppressed compared to the preceding embodiments. In addition, as the control voltage BLCLAMP fluctuates in synchronization with the voltage VSRC, the temperature-dependent variation can be reduced. Therefore, it is possible to provide a reliable semiconductor memory device.

Embodiment 4

Figure 11A:
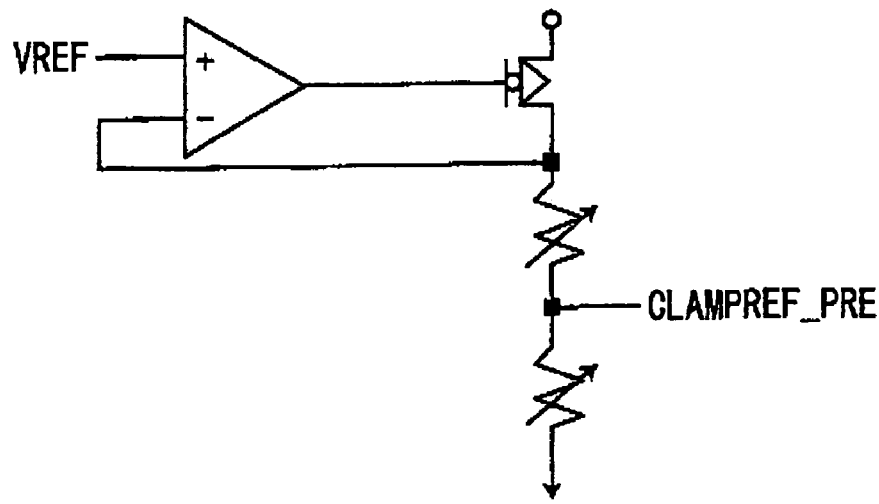
FIG. 11 shows circuit diagrams of a semiconductor memory device according to an embodiment 4.
Figure 11B:
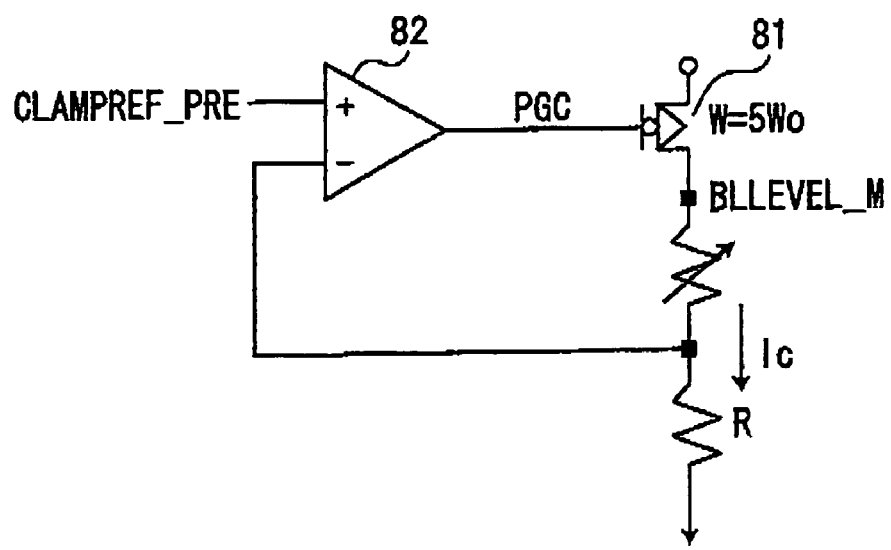
Figure 12A:
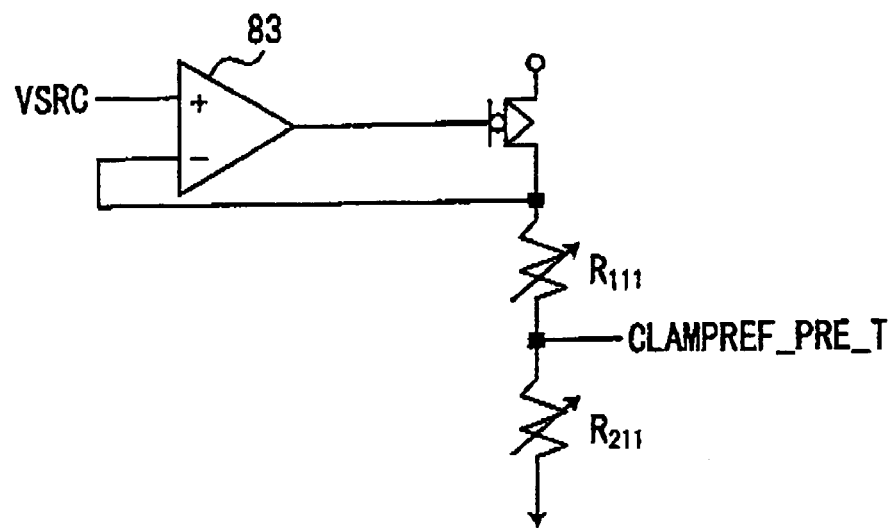
FIG. 12 shows circuit diagrams of the semiconductor memory device according to the embodiment 4.

FIGS. 11-13 show circuit diagrams of a semiconductor memory device according to an embodiment 4 of the present invention. This embodiment is obtained by further specifying the embodiment 3. This embodiment differs from the embodiment 3 in that the voltage VSRC is multiplied by 2/5 once as shown in FIG. 12A instead of using the temperature characteristic-imparted voltage VSRC to generate the voltage PGT.

First, variable resistors are varied as shown in FIG. 11A to generate the potential CLAMPREF_pre corresponding to the precharge voltage Vpre from the reference voltage VREF. The circuit as shown in FIG. 11A having a differential amplifier 72 and a PMOS transistor 73 is the same circuit configuration of FIG. 9A.

Next, as shown in FIG. 11B, a circuit including a variable resistor connected between a PMOS transistor 81 and a resistor R in the circuit structure of FIG. 9B. Accordingly a voltage PGC, which is output to a differential amplifier 82 is generated from the voltage CLAMPREF_pre. As for the resultant voltage PGC, the resistor R is adjusted such that the current Ic flowing in the resistor R satisfies Vpre/R, like in the embodiment 3. A voltage on a node between the PMOS transistor 81 and a variable resistor can be made equal to the same voltage as a later-described voltage BLLEVEL_M by setting the variable resistor.

At the supply line SRC, as shown in FIG. 12A, the values of resistors R1, R2 are adjusted so that the output voltage CLAMREF_PRE_T is equal to 2/5 the voltage VSRC fed to a differential amplifier 83. The circuit as shown in FIG. 12A having a differential amplifier 83 and a PMOS transistor 90 is the same circuit configuration of FIG. 11A.

Figure 12B:
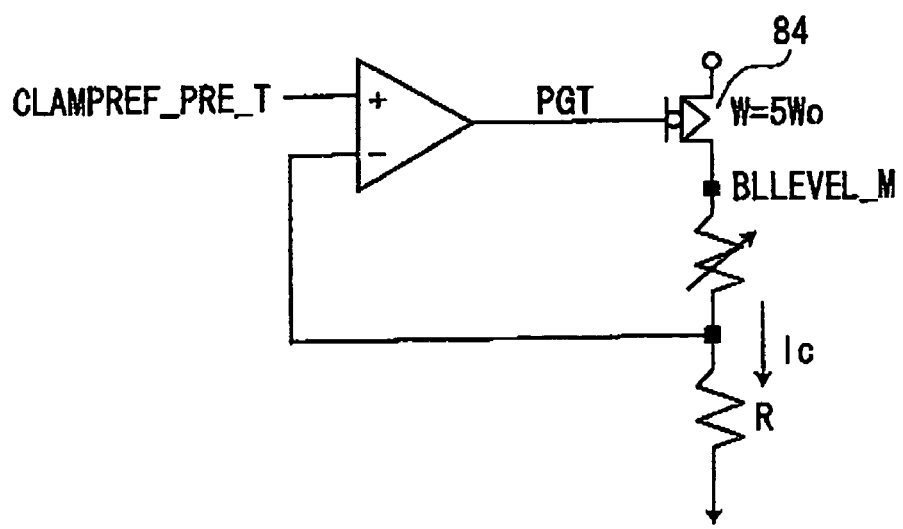

Then, as shown in FIG. 12B, the voltage CLAMREF_PRE_T is used to generate the voltage PGT. The circuit as shown in FIG. 12B having a differential amplifier 88 and a PMOS transistor 84 is the same circuit configuration of FIG. 11B. The resistor R is adjusted to generate the voltage PGT such that the current It flowing in the resistor R satisfies It=2/5×VSRC/R. A voltage on a node between a PMOS transistor 84 and a variable resistor can be made equal to the same voltage as a later-described voltage BLLEVEL_M by setting the variable resistor.

Figure 13A:
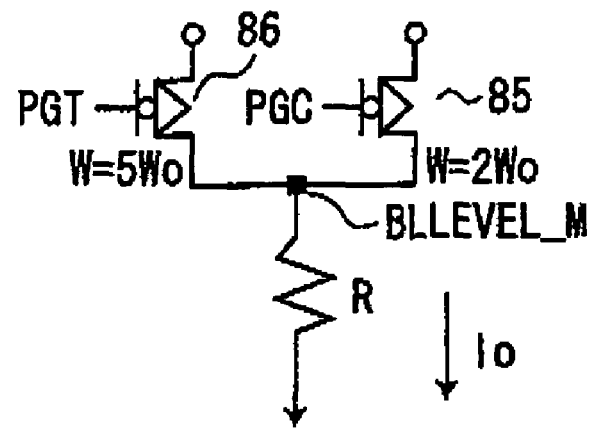
FIG. 13 shows circuit diagrams of the semiconductor memory device according to the embodiment 4.

Next, as shown in FIG. 13A, the resultant voltages PGC and PGT are mirrored at PMOS transistors 85, 86 to generate the voltage BLLEVEL_M. The voltage VSRC is multiplied by 2/5 in FIG. 11A. Accordingly, in order to multiply the voltage PGC at the BLCLAMP side by 2/5, the PMOS transistor 85 supplied with the voltage PGC has a threshold equal to 2/5 the threshold of the PMOS transistor 86 supplied with the voltage PGT. The resultant voltage BLLEVEL_M and the current I0 flowing in the resistor R are represented by 2/5×(Vpre+VSRC) and 2/5×(Vpre+VSRC)/R, respectively.

Figure 13B:
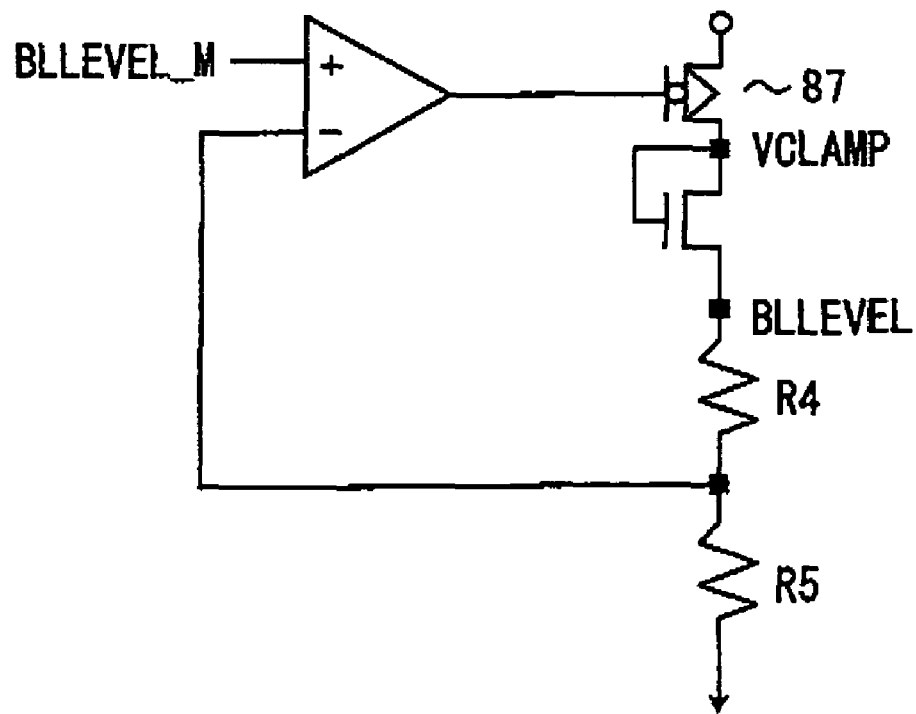

Then, as shown in FIG. 13B, resistors R4, R5 are adjusted such that the voltage BLLEVEL generated on a node between a PMOS transistor 87 and a resistor R4 is made equal to (Vpre+VSRC) as is in FIG. 10C. Namely, the resistors R4, R5 are adjusted such that the input voltage BLLEVEL_M is multiplied by 5/2. This makes it possible to generate the control voltage BLCLAMP in synchronization with the temperature characteristic-imparted voltage VSRC. The circuit as shown in FIG. 13B having a differential amplifier 89 is mostly the same circuit configuration of FIG. 10C.

The generation of the temperature characteristic-imparted precharge voltage is described as an example though the similar method is also applicable to generation of the voltage Vsen on reading. In this embodiment, multiplication by 2/5 of the voltage VSRC is described as an example though the voltage VSRC may be multiplied by arbitrarily determined times.

In the preceding embodiments, the voltage VSRC and the control voltage BLCLAMP, both temperature characteristic-imparted, are generated independently. To the contrary, in accordance with the above configuration, the control voltage BLCLAMP is generated from the voltage VSRC, thereby combining the circuits for generating temperature characteristic-imparted voltages into one. Therefore, the circuit scale can be further suppressed compared to the preceding embodiments. In addition, as the control voltage BLCLAMP is synchronized with the voltage VSRC on the supply line, the temperature-dependent variation can be reduced. Therefore, it is possible to provide a reliable semiconductor memory device.

Embodiment 5

In the power supply circuits for generating the temperature characteristic-imparted voltage configured in the preceding embodiments, the gradients of the temperature characteristics imparted to the source voltage and the control voltage BLCLAMP can be generated when the resistance ratio between Rz0, Rz1 and the resistance ratio between Ry0, Ry1 are varied together. In addition, the levels of the absolute values of the source voltage and the control voltage BLCLAMP can be generated when the resistance ratio between Ra0, Ra1 is varied.

Figure 14:
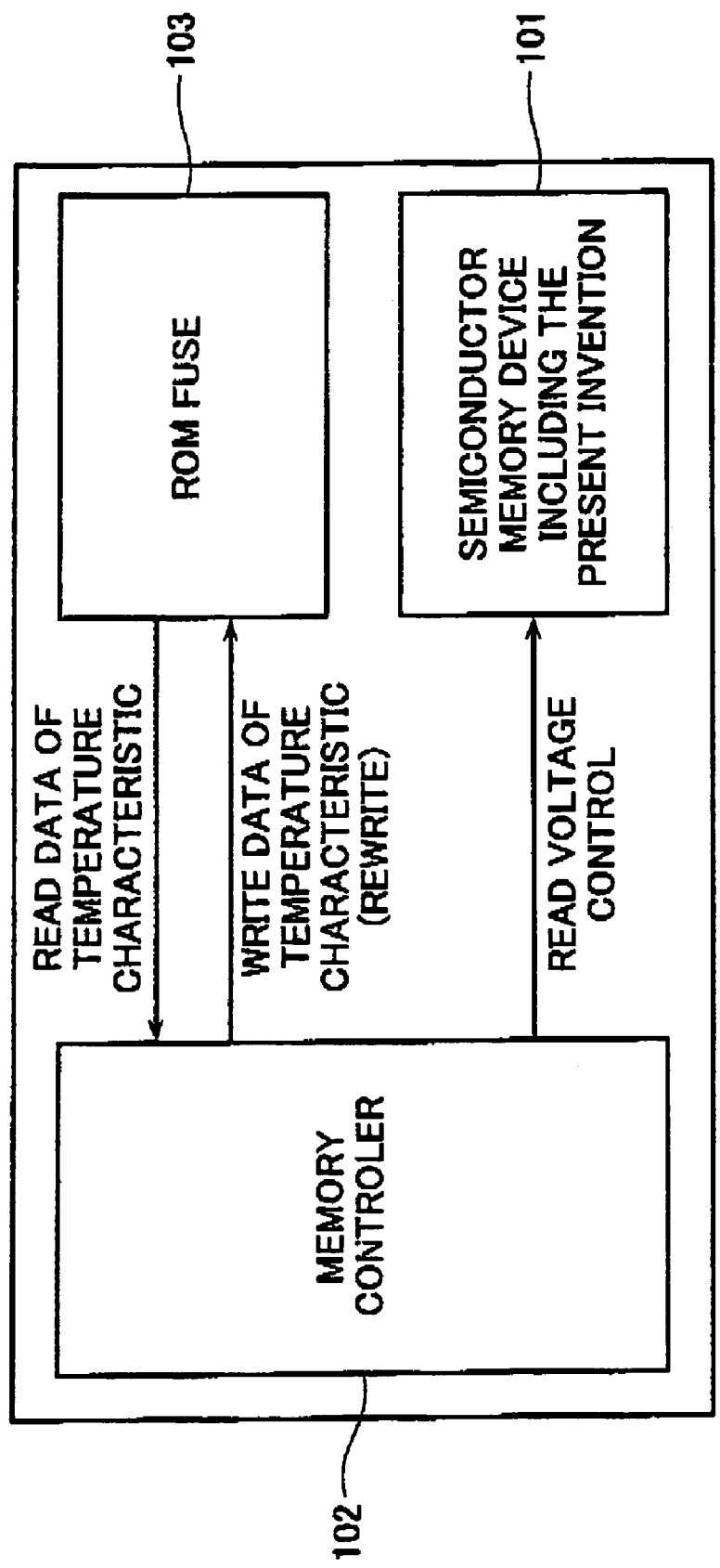
FIG. 14 is a block diagram illustrative of a method of controlling a semiconductor memory device according to an embodiment 5.

FIG. 14 shows a block diagram of a semiconductor memory device capable of controlling the temperature characteristic-imparted voltage on the source line and the well and the temperature characteristic-imparted control voltage BLCLAMP of the semiconductor memory device on reading in the preceding embodiments.

As shown in FIG. 14, a semiconductor memory device 101 shown in the preceding embodiments includes the source line and the well, both temperature characteristic-imparted. A memory controller 102 controls reading and writing the memory cell in the semiconductor memory device 101. A ROM FUSE 103 stores temperature characteristic information about the gradient of the temperature characteristic per address of the memory cell and the levels of the absolute values of the source voltage and the control voltage BLCLAMP.

The ROM FUSE 103 is not an unchangeable memory cell but a rewritable non-volatile memory cell. The temperature characteristic information stored in the ROM FUSE 103 may differ from chip to chip. Therefore, a test is previously performed before shipping and optimal values of parameters based on the test result are stored in the ROM FUSE 103.

Operation on reading data out of the memory cell is described below.

First, the memory controller 102 reads the temperature characteristic information at the address of the data read-desired memory cell from the ROM FUSE 103.

Next, in order to generate a supply voltage corresponding to desired temperature characteristic information, the memory controller 102 determines the resistance ratio between Rz0, Rz1 and the resistance ratio between Ry0, Ry1 for determining the gradients of the temperature characteristics of the above source voltage and the control voltage BLCLAMP. It also issues an instruction to the semiconductor memory device 101. Similarly, in order to determine the levels of the absolute values of the source voltage and the control voltage BLCLAMP, it determines the resistance ratio between Ra0, Ra1 and issues an instruction to the semiconductor memory device 101.

On reception of the instruction for determination of the resistance ratios, the semiconductor memory device 101 determines the resistance ratios to generate the voltages, thereby generating desired read voltages having temperature characteristics required for the source line and the well, and the control voltage BLCLAMP.

When the temperature characteristics-imparted supply voltage is supplied to a data read-desired memory cell, data can be read out of the desired memory cell normally.

Thereafter, the memory controller 102 writes in the ROM FUSE 103 a value of the resistance ratio determined in accordance with the temperature characteristic information in the ROM FUSE 103 or rewrites the temperature information corresponding to the memory cell at the same address. This eliminates the need for determining the memory cell read voltage again from the temperature characteristic information in the ROM FUSE 103 at the next time of turning the power on. In this case, the resistance ratio corresponding to the temperature characteristic information written in the ROM FUSE 103 is applicable to the memory cell as it is.

The gradients of the temperature characteristics of the source voltage and the control voltage BLCLAMP and the absolute value of the level of the control voltage BLCLAMP may vary possibly over repetitions of cell reading and erasing. Therefore, after information on deterioration of the memory cell is stored in the ROM FUSE 103, the memory controller 102 can set the parameters in accordance with the deterioration of the memory cell.

As described above, the temperature characteristic information about the memory cell array is written in the ROM FUSE 103. In this case, the temperature characteristic information about a desired memory cell, read out of the ROM FUSE 103 on memory-cell reading, can be set to have an optimal value at the memory controller 102. Thus, an optimal temperature characteristic-imparted read voltage can be set for the memory cell.

In the preceding embodiments, all reading operations are exemplified though the present invention is also applicable to verifying after completion of writing.

The present invention is not limited to the above-described embodiments but rather can be implemented in various modifications without departing from the scope and spirit of the invention.

What is claimed is:

1. A semiconductor memory device, comprising:
   a memory cell array of a plurality of memory cell units, each memory cell unit including a plurality of serially connected memory cells formed on the same well region, each memory cell having a floating gate and a control gate stacked, said serially connected memory cells having one end serially connected to a first selection gate transistor, said serially connected memory cells having the other end connected to a common source line via a second selection gate transistor;
   a sense amp connected to one end of said first selection gate transistor via a bit line and operative to read data out of said memory cell array; and
   wherein a voltage applied to said well region and said source line varies to cancel a change of threshold of said memory cells depending on the temperature.

2. The semiconductor memory device according to claim 1, further comprising;
   a first bandgap circuit connected to said well region and said source line and having a plurality of first resistors to vary a voltage applied to said well region and said source line by adjusting a resistance ratio of the first resistor.

3. The semiconductor memory device according to claim 2, wherein said first resistor comprises a variable resistor.

4. The semiconductor memory device according to claim 1,
   wherein said sense amp includes;
   a latch circuit operative to hold data read out of said memory cell;
   a sense node connected to said bit line via a clamp transistor for clamping and amplifying a voltage of said bit line; and
   wherein a clamped voltage of said bit line varies to cancel a change of threshold of said memory cells depending on the temperature using a voltage applied to a gate of said clamp transistor.

5. The semiconductor memory device according claim 4, further comprising:
   a second bandgap circuit connected to the gate of said clamp transistor and having a plurality of second transistor to vary a voltage applied to said gate by adjusting a resistance ratio of the second resistor.

6. The semiconductor memory device according to claim 5, wherein said second resistor comprises a variable resistor.

7. The semiconductor memory device according to claim 1,
   wherein in said memory cell array a voltage applied to the bit line connected to the memory cell unit in which data read is not performed is the voltage applied to said well region and said source line.

8. The semiconductor memory device according to claim 1, further comprising:
   a memory element provided to store information about a read voltage in accordance with the threshold varied according to a temperature per memory cell; and
   a memory controller operative to read information about said read voltage of a desired memory cell out of said memory element, determine the resistance ratio of said first resistors in accordance with said read voltage of said memory cell, and control reading operation of said memory cell.

9. The semiconductor memory device according to claim 8,
   wherein said memory controller writes in said memory element the resistance ratio of said first resistors in accordance with said read voltage of said memory cell.

10. The semiconductor memory device according to claim 9, wherein a memory controller reads information about said resistance ratio of said first resistors out of said memory element, performs reading operation of said memory cell according to the resistance ratio of said first resistors.

11. The semiconductor memory device according to claim 8, wherein said memory controller further determines the resistance ratio of said first resistor in accordance with information about deterioration of said memory cell.

12. The semiconductor memory device according to claim 8, wherein said memory element comprises a non-volatile memory element.

13. The semiconductor memory device according to claim 1, wherein said memory cells comprise an NAND-type flash memory.

14. The semiconductor memory device according to claim 1, a voltage applied to said bit line is generated from said voltage applied to said well region and said source line.

15. The semiconductor memory device according to claim 1, wherein said memory cell comprises a multivalue cell having multiple thresholds.

16. The semiconductor memory device according to claim 1, wherein said memory cell comprises a binary cell having a single threshold.

* * * * *